United States Patent
Curtis et al.

(10) Patent No.: US 10,390,462 B2
(45) Date of Patent: Aug. 20, 2019

(54) SERVER CHASSIS WITH INDEPENDENT ORTHOGONAL AIRFLOW LAYOUT

(71) Applicant: DELL PRODUCTS, LP, Round Rock, TX (US)

(72) Inventors: Robert Boyd Curtis, Georgetown, TX (US); Robert Warren Johnson, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 32 days.

(21) Appl. No.: 15/435,048

(22) Filed: Feb. 16, 2017

(65) Prior Publication Data
US 2018/0235105 A1 Aug. 16, 2018

(51) Int. Cl.
*G06F 1/20* (2006.01)
*H05K 7/20* (2006.01)

(52) U.S. Cl.
CPC .......... *H05K 7/20727* (2013.01); *G06F 1/20* (2013.01); *H05K 7/20145* (2013.01)

(58) Field of Classification Search
CPC .............. G06F 1/181–182; G06F 1/20; H05K 7/20218–20381; H05K 7/20409–20418; H05K 7/20009–202; H05K 7/20727; H05K 7/20145; H01L 23/367–3677; H01L 23/473; H01L 23/46–467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 5,572,403 A | 11/1996 | Mills | |
| 7,742,844 B2 | 7/2010 | Coxe, III | |
| 7,933,120 B2 * | 4/2011 | Tanaka | H05K 7/20727 312/223.2 |
| 8,854,814 B2 * | 10/2014 | Liu | H05K 7/20736 361/695 |
| 9,215,829 B2 * | 12/2015 | Baba | H05K 7/1452 |
| 9,769,959 B2 * | 9/2017 | Mayenburg | H05K 5/0213 |
| 2004/0130868 A1 * | 7/2004 | Schwartz | G06F 1/20 361/679.48 |
| 2008/0192431 A1 * | 8/2008 | Bechtolsheim | G06F 1/20 361/695 |
| 2008/0298014 A1 * | 12/2008 | Franco | G06F 1/183 361/688 |
| 2009/0016019 A1 * | 1/2009 | Bandholz | G06F 1/20 361/695 |

(Continued)

*Primary Examiner* — Anthony M Haughton
*Assistant Examiner* — Razmeen Gafur
(74) *Attorney, Agent, or Firm* — Larson Newman, LLP

(57) ABSTRACT

A chassis includes a front and back portion. The front portion includes a plurality of compute devices and a first plurality of fans. The back portion includes a plurality of input/output devices and a second plurality of fans. A first airflow zone extends from the front portion to the back portion, the first airflow zone to direct a first airflow from the compute device to the second fans. A second airflow zone extends from the front portion to the back portion, the second airflow zone to provide a second airflow from the first fans to the input/output devices, and to isolate the second airflow from the first airflow zone.

20 Claims, 8 Drawing Sheets

(56) References Cited

U.S. PATENT DOCUMENTS

| | | | |
|---|---|---|---|
| 2009/0046429 A1* | 2/2009 | Werner | H05K 7/20736 361/701 |
| 2009/0059515 A1* | 3/2009 | Tsakanikas | G06F 1/18 361/679.49 |
| 2009/0097204 A1* | 4/2009 | Byers | H05K 7/20572 361/695 |
| 2009/0109619 A1* | 4/2009 | Wise | H05K 7/20836 361/695 |
| 2010/0014248 A1* | 1/2010 | Boyden | H05K 7/20563 361/695 |
| 2010/0033930 A1* | 2/2010 | Wada | G11B 33/142 361/695 |
| 2010/0134972 A1* | 6/2010 | Moss | H05K 7/20736 361/679.49 |
| 2010/0172078 A1* | 7/2010 | Tanaka | G11B 33/142 361/679.5 |
| 2010/0321874 A1* | 12/2010 | Bhattacharyya | H05K 7/20736 361/679.5 |
| 2011/0128699 A1* | 6/2011 | Heydari | H05K 7/20836 361/679.48 |
| 2011/0130891 A1* | 6/2011 | Nielsen | G06F 1/206 700/300 |
| 2011/0292593 A1* | 12/2011 | June | G06F 1/206 361/679.47 |
| 2012/0327597 A1* | 12/2012 | Liu | H05K 7/20736 361/692 |
| 2014/0133091 A1* | 5/2014 | Shah | H05K 7/1488 361/679.48 |
| 2015/0098173 A1* | 4/2015 | Leigh | H05K 7/1487 361/679.5 |
| 2015/0181760 A1* | 6/2015 | Stephens | H05K 3/368 361/695 |
| 2015/0181774 A1* | 6/2015 | Baetz | H05K 3/368 361/785 |
| 2015/0282385 A1* | 10/2015 | Pamley | H05K 7/20209 361/679.48 |
| 2015/0305206 A1* | 10/2015 | Fukuda | G11B 33/128 361/679.49 |
| 2015/0319883 A1* | 11/2015 | Branton | H05K 7/20754 361/679.53 |
| 2016/0050796 A1* | 2/2016 | Mayenburg | H05K 5/0213 361/679.48 |
| 2016/0079613 A1* | 3/2016 | Gurunathan | H05K 7/20154 429/439 |
| 2016/0100506 A1 | 4/2016 | Bailey et al. | |
| 2016/0106007 A1 | 4/2016 | Embleton et al. | |
| 2016/0174413 A1* | 6/2016 | Steinbrecher | H05K 7/20727 361/679.51 |
| 2016/0381818 A1* | 12/2016 | Mills | H05K 5/0217 361/724 |
| 2017/0235347 A1* | 8/2017 | Heyd | G11B 33/128 361/679.31 |
| 2017/0311486 A1* | 10/2017 | Milligan | H05K 7/20736 |
| 2017/0315597 A1* | 11/2017 | Petruzzo | G06F 1/20 |

* cited by examiner

SERVER CHASSIS WITH INDEPENDENT ORTHOGONAL AIRFLOW LAYOUT

FIELD OF THE DISCLOSURE

The present disclosure generally relates to information handling systems, and more particularly relates to a server chassis with independent orthogonal airflow layout.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A chassis includes front and back portions. The front portion may include a plurality of compute devices and a first plurality of fans. The back portion may include a plurality of input/output devices and a second plurality of fans. A first airflow zone may extend from the front portion to the back portion, the first airflow zone to provide a first airflow from the compute device to the second fans. A second airflow zone may extend from the front portion to the back portion, the second airflow zone to provide a second airflow from the first fans to the input/output devices, and to isolate the second airflow from the first airflow zone.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
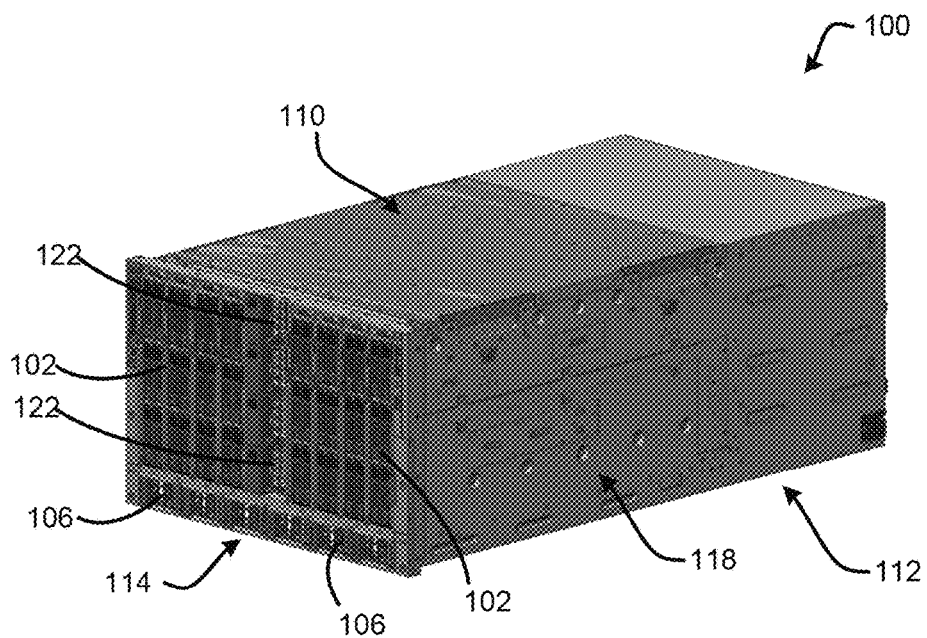
FIG. 1 is a front perspective view of a server chassis according to at least one embodiment of the present disclosure.
Figure 2:
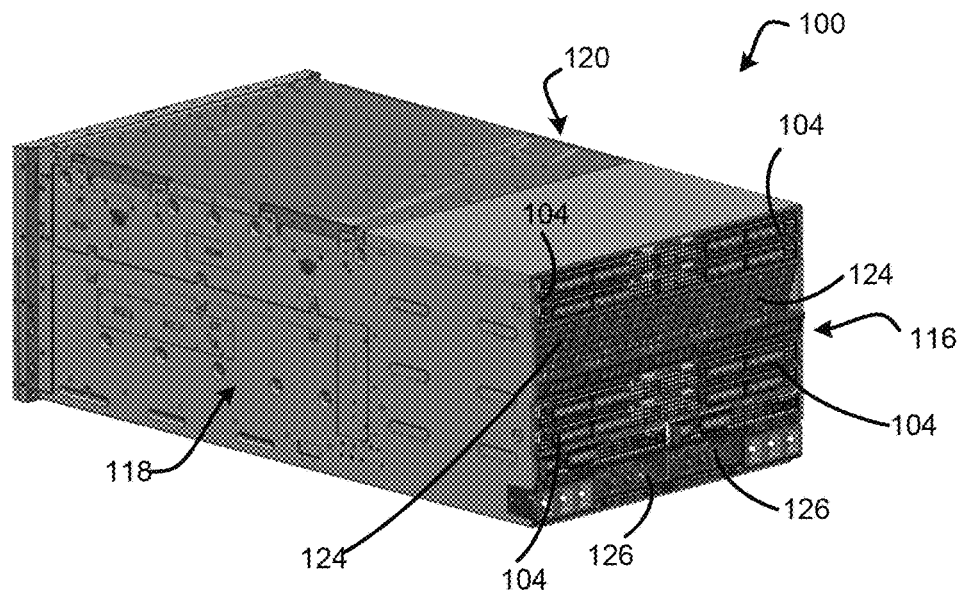
FIG. 2 is a rear perspective view of a server chassis according to at least one embodiment of the present disclosure.

FIGS. 1 and 2 show a chassis 100 to hold multiple information handling systems, such as compute devices 102, input/output (I/O) devices 104, and power supply units 106. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The chassis includes a top panel 110, a bottom panel 112, a front panel 114, a back panel 116, and side panels 118 and 120. The components and devices located within the front panel 114 the chassis 100 include multiple compute devices 102, power supply units 106, and fans 122. In an embodiment, the compute devices 102 can be peripheral devices, such as storage devices, peripheral component interconnect express (PCIe) devices, or the like. In an embodiment, the compute devices 102 can utilize most of the space of the front panel 114 except where the power supply units 106 extend horizontally across the bottom of the front panel 114 adjacent to the bottom panel 112, and the fans 122 extend vertically down the center of the front panel from the top panel 110 to the top of the power supply units 106.

The components and devices located within the back panel 116 the chassis 100 include multiple I/O devices 104, a first group of fans 124. In an embodiment, a first portion of the I/O devices 104 can be oriented horizontally across the top of the back panel 116. The fans 124 can be located in a horizontal row below the first portion of I/O devices 104 within the back panel 116, and a second portion of the I/O devices 104 can be located in a horizontal row below the fans 124 within the back panel 116. In an embodiment, the chassis 100 can be divided into multiple discrete airflow zones, such as zone 302, zone 304, and zone 306 shown in FIGS. 3 and 4 below.

In an embodiment, each the power supply units 106 includes fan within the power supply unit itself. In this embodiment, the back panel 116 includes exhaust ports 126 to expel air from the fans of the power supply units 106. In another embodiment, the fans within the power supply units 106 may be moved to the exhaust ports 126 without varying from the scope of the disclosure.

Figure 3:
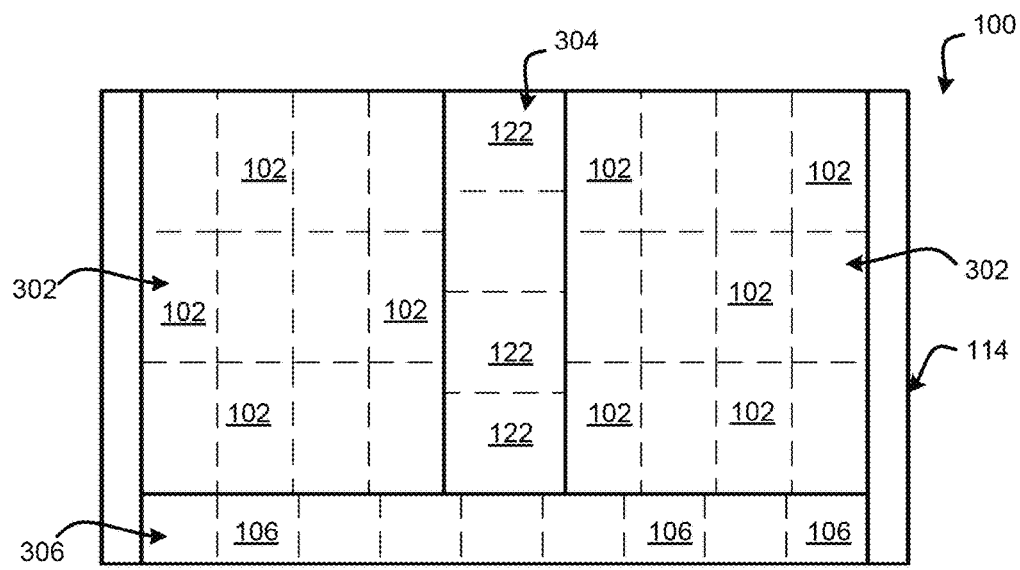
FIG. 3 is a block diagram of a front panel of the server chassis with multiple airflow zones according to at least one embodiment of the present disclosure.
Figure 4:
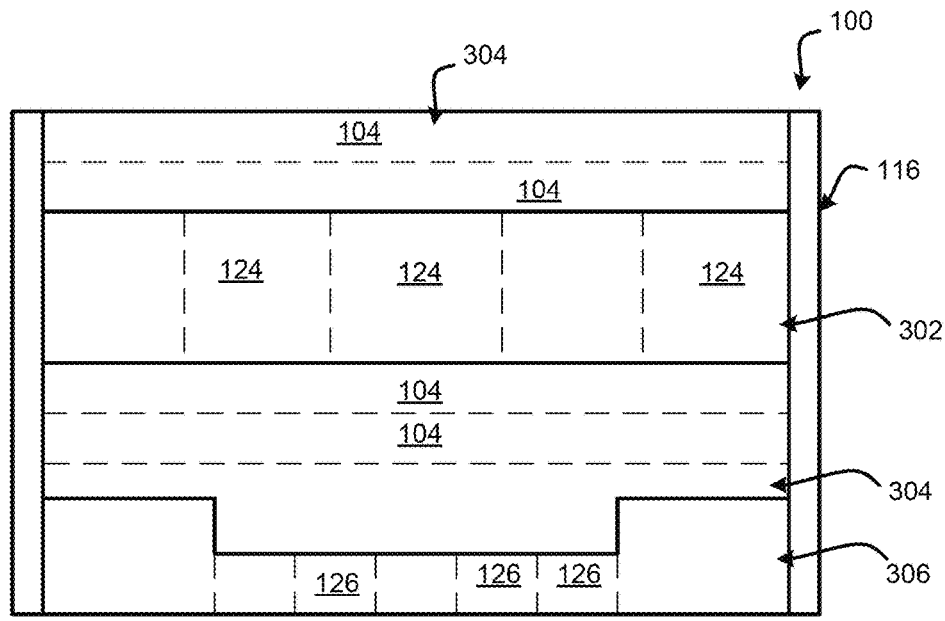
FIG. 4 is a block diagram of a rear panel of the server chassis with multiple airflow zones according to at least one embodiment of the present disclosure.

FIG. 3 shows the front panel 114 of the chassis 100 divided into multiple airflow zones 302, 304, and 306 according to at least one embodiment of the present disclose. FIG. 4 shows the rear panel 116 of the chassis 116 divided into the multiple airflow zones 302, 304, and 306 according to at least one embodiment of the present disclose. In an embodiment, each of the airflow zones 302 and 304 are orthogonal. For example, the two portions airflow zone 302 are vertically oriented within the front panel 114, and these two vertically oriented portions connect with a horizontally oriented fans 124 location within airflow zone 302 of the back panel 116. The fans 124 pull air from the front panel 114 across the compute devices 102 and out the back panel 116 to provide cooling of only the compute devices 102.

The fans 122 in the airflow zone 304 in the front panel are vertically oriented, and the vertically oriented fans 122 push air through the chassis and to both of the horizontally oriented sections of the I/O device 104 within the airflow zone 304 of the back panel 116. Thus, the fans 122 of airflow zone 304 provide cooling air to the I/O modules 104 without the air traveling past other components of the chassis 100. In an embodiment, the airflow zone 306 directs airflow from the fans within the power supply units 106 to the exhaust ports 126 of the back panel 116. Thus, the fans pull air from the front panel 114 and provide the air across the power supply units 106, and then push the air out of the exhaust ports 126 in the back panel 116 to provide cooling of the only power supply units 106. One of ordinary skill in the art will recognize that while three airflow zones are described herein, more or less airflow zones can be utilized in the chassis 100 without varying from the scope of the disclose.

Figure 5:
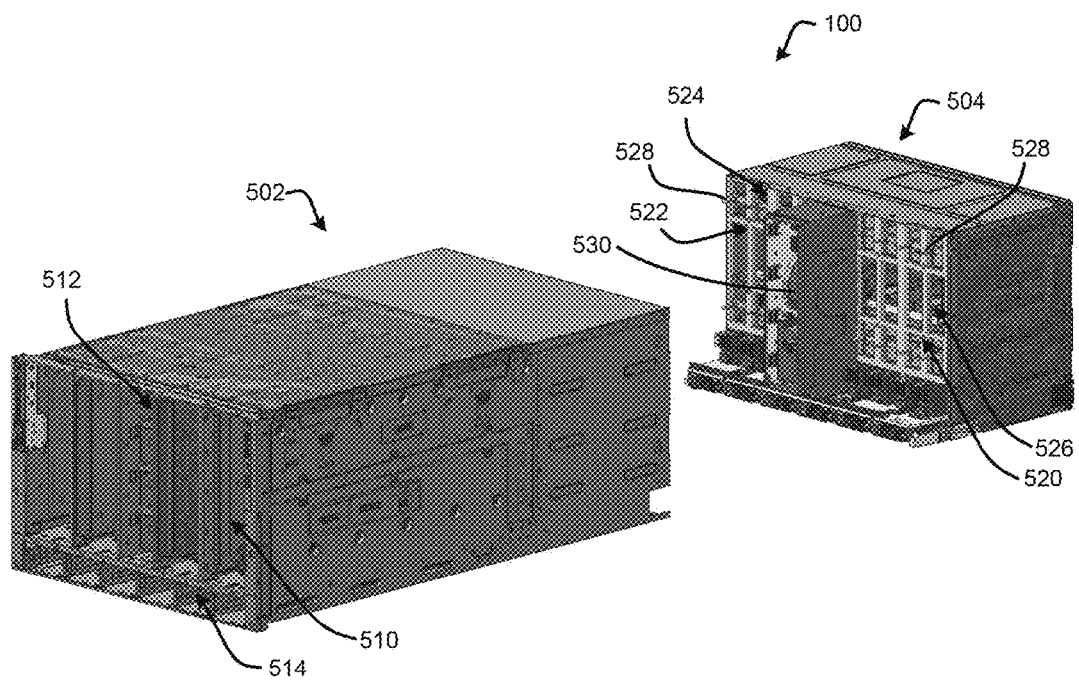
FIG. 5 is a front perspective view of the server chassis expanded according to at least one embodiment of the present disclosure.

FIG. 5 shows a front perspective expanded view of the server chassis 100 including front portion 502 and a rear portion 504 according to at least one embodiment of the present disclose. The front portion 502 includes slots 510 for the compute devices 102, slots 512 for the fans 122, and slots 514 for the power supply units 506. The back portion 504 includes a bulkhead 520, a sealing surface 522, shelving 524 for the I/O devices 104, supports 526 for the fans 124, and alignment pins 528. The bulkhead 520 includes an airflow guide 530 to direct the airflow from the fans 122 to both the upper and lower I/O devices 104 in the back portion 504. In an embodiment, the airflow guide 530 can be a 'U' shape, a 'V' shape, or the like.

The alignment pins 528 can be utilized to properly align the front compute 102 and back IO modules 104 when those components are being assembled. When the front portion 502 and the back portion 504 are connected together, the bulkhead 520 can seal to a back portion of the fans 122 to provide/direct airflow from the fans 122 to the I/O devices 104, via the airflow guide 530, without leakage from the airflow zone 304 into the airflow zones 302 and 306. The sealing surface 522 can seal a connection between the airflow zone 302 in the front portion 502 and the airflow zone 302 of the back portion 504. The seal created by the sealing surface 522 can prevent airflow leakage from airflow zone 302 into airflow zones 304 and 306. The connection of the front and back portions 502 and 504 can also create a sealed connection in the airflow zone 306 to prevent airflow leakage from airflow zone 306 into airflow zones 302 and 304. The gaps in the slots 524 for the I/O devices 104 can be filled by the I/O modules, such that airflow in airflow zone 304 will not leak into airflow zone 302. In an embodiment, the I/O devices can be Fab-A/B devices, Fab-C I/O devices, management controller devices, or the like. In an embodiment, the openings in the sealing surface 522 that are aligned with the shelving 524 for the fans 124 enable air to be pulled by the fans 124 from airflow zone 302 in the front portion 502 to the airflow zone 302 of the back portion 504.

Figure 6:
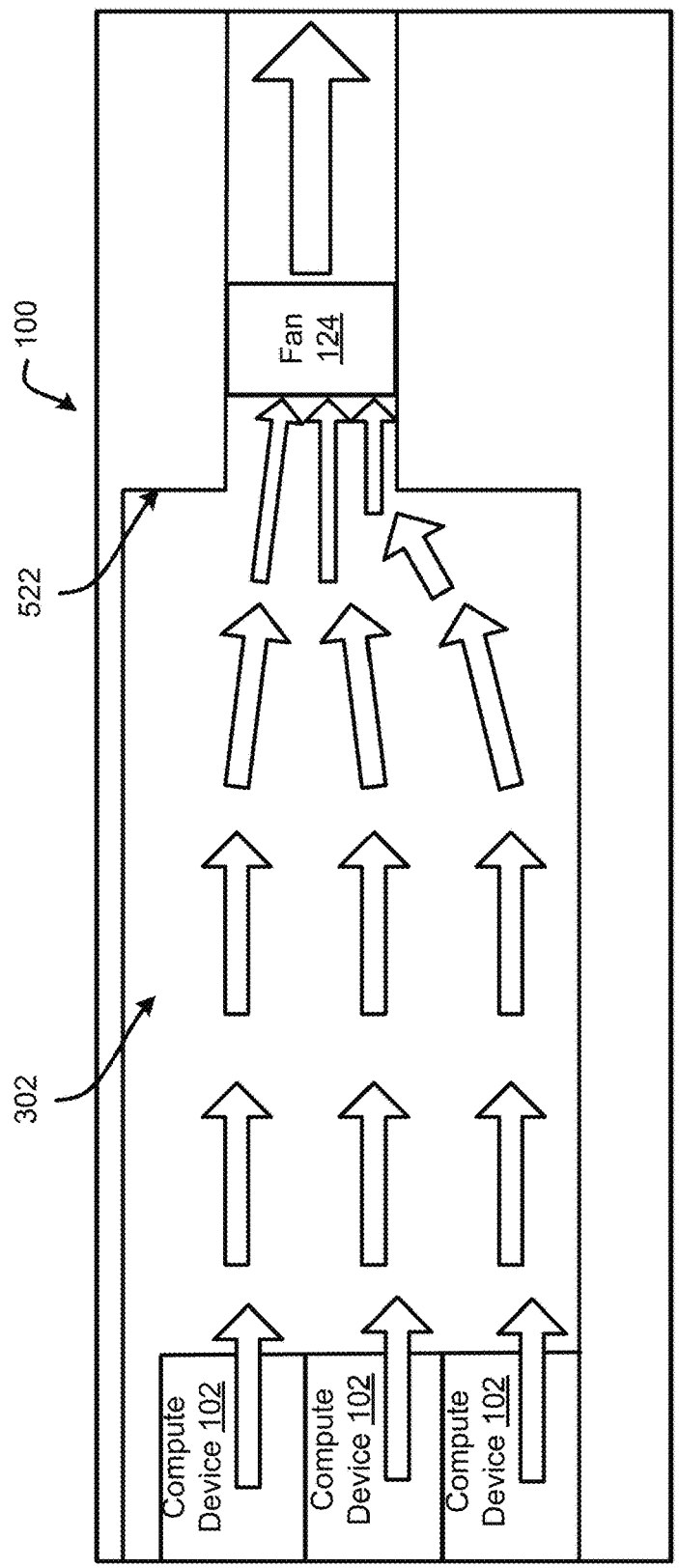
FIG. 6 is a block diagram illustrating airflow in a cross section of a first zone of airflow in the server chassis according to at least one embodiment of the present disclosure.

FIG. 6 illustrates a cross section of airflow zone 302 in the server chassis 100 according to at least one embodiment of the present disclose. The compute devices 102 are placed in the front of the chassis 100, and air is pulled across the compute devices 102 as represented by the arrows. The air is then pulled by the fans 124 through the airflow zone 302 and directed by the openings in the sealing surface 522 to the fans 124, which in turn then push the air out of the back of the chassis 100. Thus, the air in the airflow zone 302 is only used to remove heat from the compute devices 102 of the chassis 100.

Figure 7:
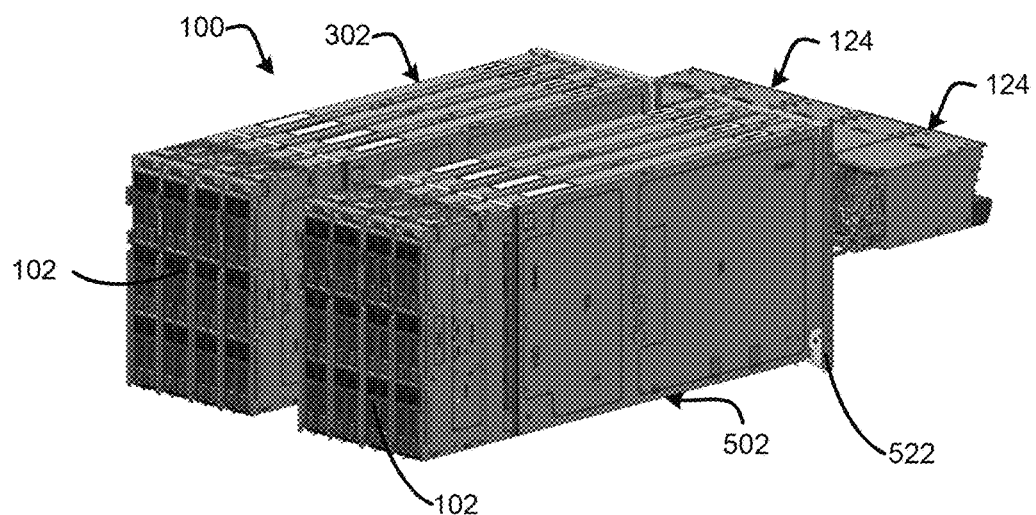
FIG. 7 is a front perspective view of components in the first zone of airflow of the server chassis according to at least one embodiment of the present disclosure.
Figure 8:
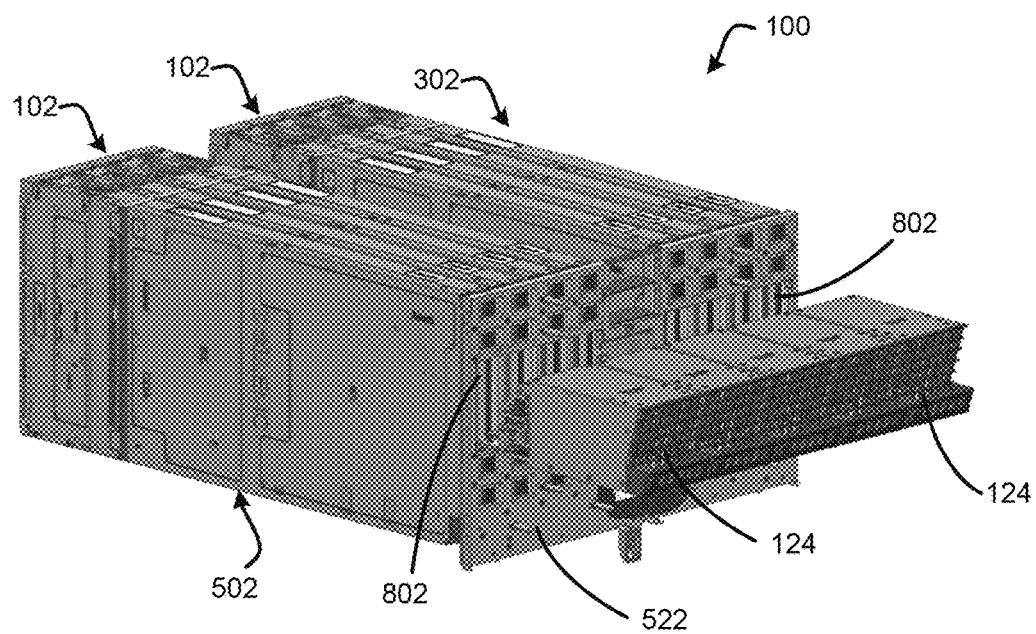
FIG. 8 is a rear perspective view of components in the first zone of airflow of the server chassis according to at least one embodiment of the present disclosure.

FIGS. 7 and 8 illustrate respective front and rear perspective view of only the components located within the airflow zone 302 of the server chassis 100 according to at least one embodiment of the present disclose. The sealing surface 522 is connected to the back of the front portion 502 of airflow zone 302 to prevent airflow leakage from the airflow zone 302. The sealing surface 522 includes openings 802 to direct air from the front portion 502 to the fans 124 of the airflow zone 302.

Figure 9:
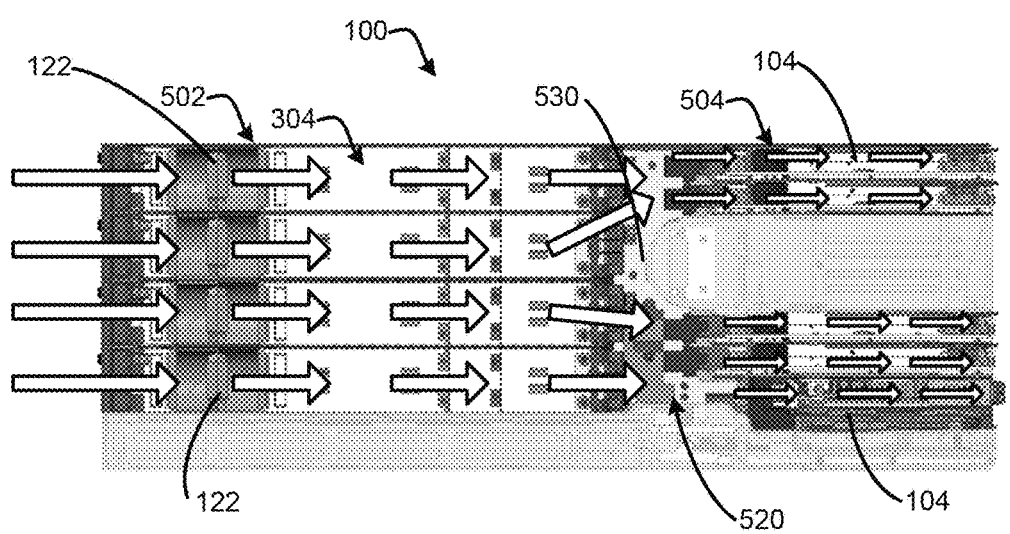
FIG. 9 is a diagram illustrating airflow in a cross section of a second zone of airflow in the server chassis according to at least one embodiment of the present disclosure.

FIG. 9 illustrates a cross section of airflow zone 304 in the server chassis 100 according to at least one embodiment of the present disclose. The fans 122 of the airflow zone 304 push cool air through the first portion 502 of the airflow zone 304, as represented by the arrows, to the bulkhead 520, which includes the airflow guide 530 to direct the air to both the top and bottom portions of the I/O devices 104 in the back portion 504 of the chassis 100. The air is pushed across the I/O devices 104 as represented by the arrows. The air removes heat produced by the I/O devices 104 and is pushed out of the back portion 504 of the chassis 100. Thus, the air in the airflow zone 304 is only used to remove heat from the I/O devices 104 of the chassis 100.

Figure 10:
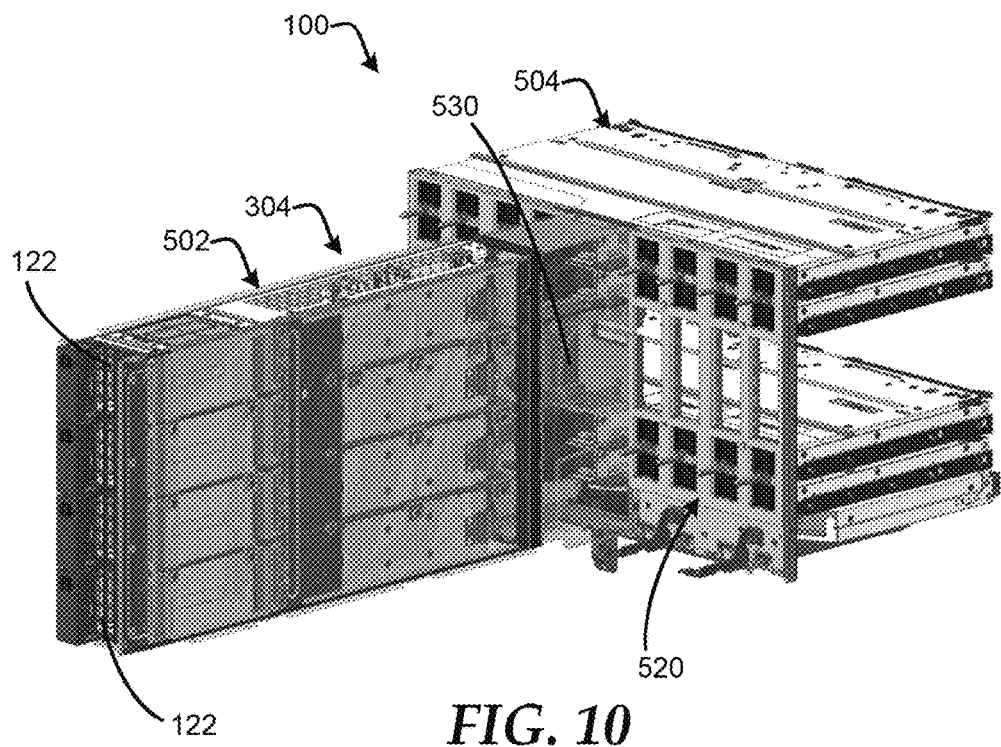
FIG. 10 is a front perspective view of components in the second zone of airflow of the server chassis according to at least one embodiment of the present disclosure.
Figure 11:
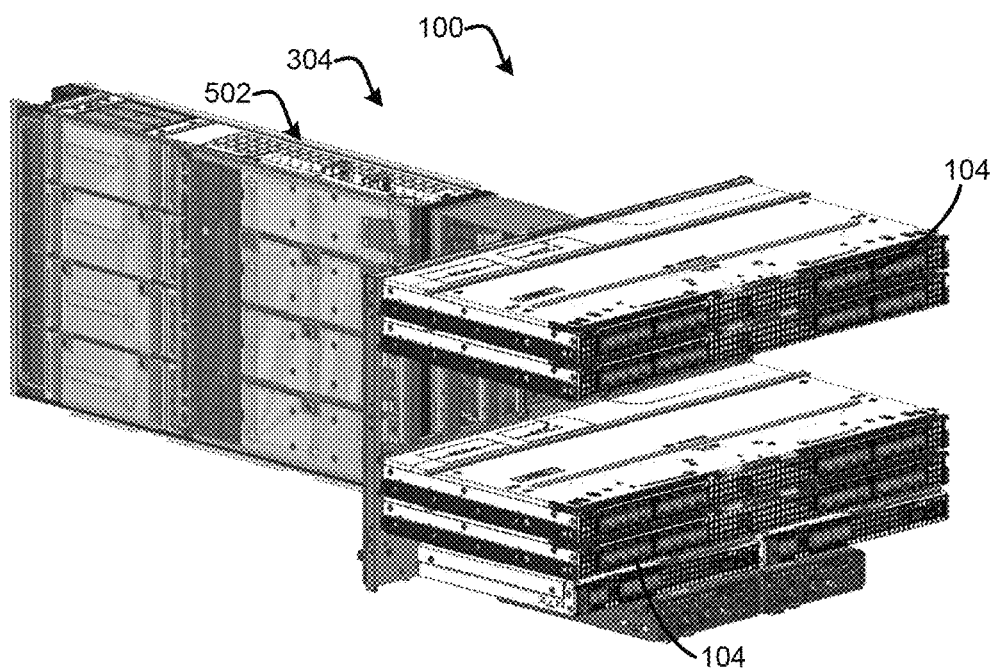
FIG. 11 is a rear perspective view of components in the second zone of airflow of the server chassis according to at least one embodiment of the present disclosure.

FIGS. 10 and 11 illustrate respective front and rear perspective view of only the components located within the airflow zone 304 of the server chassis 100 according to at least one embodiment of the present disclose. The bulkhead 520 is connected to the back of the front portion 502 of airflow zone 304 to prevent airflow leakage from the airflow zone 304. The airflow guide 530 directs the air from fans 122 in the front portion 502 to the upper and lower portions of the I/O devices 104 in the rear portion 504 of the chassis 100. The airflow zone 304 can greatly increase the cooling capacity for the I/O devices 104 as compared to traditional cooling layouts, because the air in the airflow zone 304 is only used to cool the I/O devices 104. In an embodiment, as the airflow enters the back portion 504, the airflow can expand within the horizontal plane of the airflow zone 304 within the back portion 504 to cool each I/O device 104.

Figure 12:
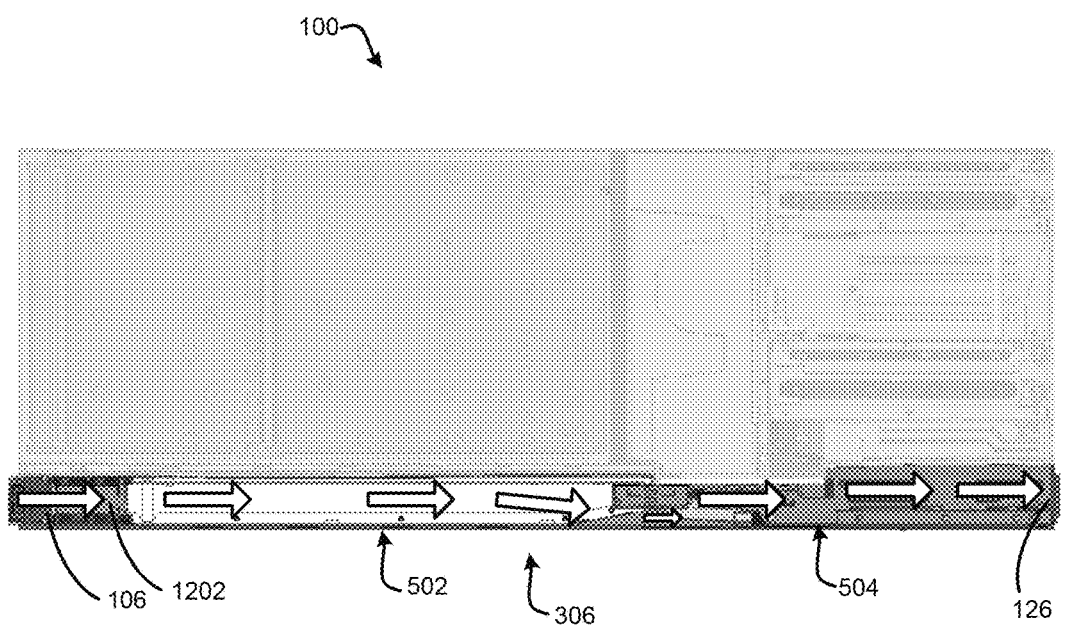
FIG. 12 is a diagram illustrating airflow in a cross section of a third zone of airflow in the server chassis according to at least one embodiment of the present disclosure.

FIG. 12 illustrates a cross section of airflow zone 306 in the server chassis 100 according to at least one embodiment of the present disclose. The power supply units 106 including fans 1202 are located in the front portion 502 of the chassis 100, and air is moved across the power supply units 106 as represented by the arrows. The air is then pushed through the airflow zone 306 to the exhaust ports 126, which in turn enable the air escape out of the back portion 504 of the chassis 100. The airflow zone 306 is a discrete airflow zone without airflow leakage into the other zones 302 and 304 of the chassis 100. Thus, the air in the airflow zone 306 is only used to remove heat from the power supply units 106 of the chassis 100.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A chassis comprising:
   a plurality of compute devices located within a front portion of the chassis;
   a plurality of input/output devices located within a back portion of the chassis;
   a first plurality of fans located within the front portion of the chassis, wherein the first fans provide a first airflow to only the input/output devices;
   a second plurality of fans located within the back portion of the chassis, wherein the second fans provide a second airflow to only the compute devices, wherein the second airflow provided to the compute devices by the second fans is isolated from the second airflow provided to the input/output devices by the first fans; and
   a plurality of power supply units including a third plurality of fans, wherein the third fans provide a third airflow to only the power supply units.

2. The chassis of claim 1 further comprising:
   a bulkhead connected between the front portion and the back portion, the bulkhead to direct the first airflow from the first fans to the input/output devices.

3. The chassis of claim 1 further comprising:
   a sealing surface connected between the front portion and the back portion, the sealing surface includes a plurality of openings to direct the first airflow from the compute devices to the second fans.

4. The chassis of claim 1 wherein the compute devices and the first fans are vertically oriented within the front portion of the chassis.

5. The chassis of claim 4 wherein the input/output devices and the second fans are horizontally oriented within the back portion of the chassis.

6. The chassis of claim 1 wherein the first fans are configured to be located between a first group of the compute devices and a second group of the compute devices.

7. The chassis of claim 1 wherein the second fans are configured to be located between a first group of the input/output devices and a second group of the input/output devices.

8. The chassis of claim 1 further comprising a front panel, wherein the first fans are configured to extend vertically down the center of the front panel.

9. The chassis of claim 7 further comprising a back panel, wherein the first fans are configured to extend horizontally across the back panel.

10. A chassis comprising:
    a front portion including a plurality of compute devices and a first plurality of fans;
    a back portion including a plurality of input/output devices and a second plurality of fans;
    a first airflow zone extending from the front portion to the back portion, the first airflow zone to direct a first airflow from the compute device to the second fans;
    a second airflow zone extending from the front portion to the back portion, the second airflow zone to direct a second airflow from the first fans to the input/output devices, wherein the first airflow zone isolates the first airflow from the input/output devices and the first fans; and
    a third airflow zone extending from the front portion to the back portion, the third airflow zone to direct a third airflow from a plurality of power supply units in the front portion to a plurality of exhaust ports in the back portion, wherein the third airflow is provided only to the power supply units.

11. The chassis of claim 10 further comprising:
    a bulkhead connected between the front portion and the back portion, the bulkhead to direct the second airflow from the first fans to the input/output devices.

12. The chassis of claim 10 further comprising:
    a sealing surface connected between the front portion and the back portion, the sealing surface includes a plurality of openings to direct the second airflow from the compute devices to the second fans.

13. The chassis of claim 10 wherein the second airflow zone isolates the second airflow from the compute devices and the second fans.

14. The chassis of claim 10 wherein the compute devices and the first fans are vertically oriented within the front portion of the chassis.

15. The chassis of claim 14 wherein the input/output devices and the second fans are horizontally oriented within the back portion of the chassis.

16. The chassis of claim 11 wherein the bulkhead includes an airflow guide, the airflow guide configured to direct the second airflow to a first group of the input/output devices and to a second group of the input/output devices.

17. A chassis comprising:
    a front portion including a plurality of compute devices and a first plurality of fans;
    a back portion including a plurality of input/output devices and a second plurality of fans;
    a first airflow zone extending from the front portion to the back portion, the first airflow zone to direct a first airflow from the compute device to the second fans;
    a second airflow zone extending from the front portion to the back portion, the second airflow zone to direct a second airflow from the first fans to the input/output devices, wherein the first airflow zone isolates the first airflow from the input/output devices and the first fans, and the second airflow zone isolates the second airflow from the compute devices and the second fans;
    a third airflow zone extending from the front portion to the back portion, the third airflow zone to direct a third airflow from a plurality of power supply units in the front portion to a plurality of exhaust ports in the back portion, wherein the third airflow is provided only to the power supply units;
    a bulkhead connected between the front portion and the back portion, the bulkhead to direct the second airflow from the first fans to the input/output devices; and
    a sealing surface connected between the front portion and the back portion, the sealing surface including a plurality of openings to direct the second airflow from the compute devices to the second fans.

18. The chassis of claim 17 wherein the compute devices and the first fans are vertically oriented within the front portion of the chassis.

19. The chassis of claim 18 wherein the input/output devices and the second fans are horizontally oriented within the back portion of the chassis.

20. The chassis of claim 17 wherein the openings are configured to enable the second fans to pull the first airflow from the compute devices to the back portion and to enable the first fans to push the second airflow from the front portion to the input/output devices.

* * * * *